United States Patent
Tsao et al.

(10) Patent No.: US 7,638,887 B2
(45) Date of Patent: Dec. 29, 2009

(54) PACKAGE STRUCTURE AND FABRICATION METHOD THEREOF

(75) Inventors: Pei-Haw Tsao, Taichung (TW);
Chender Huang, Kaohsiung (TW);
Chuen-Jye Lin, Taichung Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 47 days.

(21) Appl. No.: 11/030,097

(22) Filed: Jan. 7, 2005

(65) Prior Publication Data

US 2006/0163714 A1    Jul. 27, 2006

(51) Int. Cl.
*H01L 23/28*    (2006.01)

(52) U.S. Cl. ............... 257/787; 257/794; 257/E23.116; 257/E23.127

(58) Field of Classification Search ......... 257/787–796, 257/E23.116, E23.127
See application file for complete search history.

(56) References Cited

U.S. PATENT DOCUMENTS

| | | | |
|---|---|---|---|
| 6,649,991 B1 * | 11/2003 | Chen et al. | 257/433 |
| 6,900,531 B2 * | 5/2005 | Foong et al. | 257/687 |
| 7,183,589 B2 * | 2/2007 | Kameyama et al. | 257/100 |
| 2001/0034083 A1 * | 10/2001 | Coyle et al. | 438/127 |
| 2004/0080037 A1 | 4/2004 | Foong et al. | |
| 2007/0096312 A1 * | 5/2007 | Humpston et al. | 257/734 |

FOREIGN PATENT DOCUMENTS

| | | |
|---|---|---|
| JP | 05-074867 A | 3/1993 |
| JP | 2000-323614 A | 11/2000 |
| JP | 2000-349202 A | 12/2000 |
| JP | 2004-319530 A1 | 11/2004 |
| TW | 094116089 * | 7/1993 |

* cited by examiner

*Primary Examiner*—Monica Lewis
(74) *Attorney, Agent, or Firm*—Birch, Stewart, Kolasch & Birch, LLP

(57) ABSTRACT

A package structure and fabrication method thereof. The structure includes a substrate having a terminal, a chip overlying the substrate, the chip having an active surface, having a center region and periphery region, the periphery region having an electrode thereon, a patterned cover plate overlying the chip and exposing the electrode, a conductive material electrically connecting the electrode and terminal, and an encapsulant covering the terminal, conductive material, and electrode, but exposing the cover plate overlying the center region of the chip.

8 Claims, 7 Drawing Sheets

PACKAGE STRUCTURE AND FABRICATION METHOD THEREOF

BACKGROUND

The invention relates to an electronic device and fabrication method thereof, and more specifically to a package structure and fabrication method thereof.

A semiconductor chip such as an image chip is typically packaged by attachment to an area surrounded by a dam of a special chip carrier and formation of electrical connection between the chip and chip carrier, followed by encapsulation of the chip resulting from disposition of a glass sheet above the chip on the dam. The chip carrier with a dam is specially designed and manufactured for packaging an image chip, and the encapsulation structure includes the dam, glass sheet, a adhesive layer between the dam and glass sheet, and air between the chip and glass. This process is very complicated, has high production cost and low product reliability. Additionally, the interface between the dam and glass sheet may not be completely sealed, and thus destructive encapsulation testing is required, further increasing production cost and lowering throughput. Moreover, the chip may be exposed for a long time until disposition of the glass sheet, resulting in particle or other contaminations on the chip.

In a CSP (chip scale package) disclosed by SHELLCASE, a chip 601 with an image sensor 602 is laminated between a top glass sheet 650 and a bottom glass sheet 610 and completely encapsulated in epoxy 611 and 612 as shown in FIG. 6. This CSP has a simpler package structure, wiring thereof, however, is complicated as described in the following.

First, a wiring 604 is extended from a pad 603 of the chip 601 to an edge thereof, chip 601 and glass sheets 610, 650 are then laminated. When the chip 601 and bottom glass sheet 610 are cut or etched to divide the chip 601 from a wafer (not shown), exposing an end of the wiring 604, the wiring 604 is further extended along a sidewall of the chip 601 and bottom glass sheet 610 to a bottom surface thereof, followed by formation of solder bumps 614 on pads 613 thereon. The wiring extension is complicated and the wiring 604 may peel at the edge of chip 601 and at edges of the bottom surface of the bottom glass sheet 610, negatively affecting production cost and yield.

SUMMARY

Thus, embodiments of the invention provide a package structure and fabrication method thereof, reducing structural and wiring complexities and chip contamination thereof, thereby reducing production cost and improving production yield and product reliability.

An aspect of the invention provides a method of encapsulating a chip, such as an image chip, utilizing a simpler encapsulation structure.

Another aspect of the invention provides a package structure with simplified wiring.

Embodiments of the invention provide a package structure. The structure includes a substrate, a chip, a patterned cover plate, conductive material, and encapsulant. The substrate has a terminal. The chip is disposed overlying the substrate. The chip has an active surface, having a center region and periphery region. The periphery region has an electrode thereon. The patterned cover plate is overlying the chip and exposes the electrode. The conductive material electrically connects the electrode and terminal. The encapsulant covers the terminal, conductive material, and electrode, while leaving the cover plate overlying the center region of the chip exposed.

Embodiments of the invention additionally provide a package structure. The structure includes a substrate, a chip, a patterned transparent plate, conductive material, and encapsulant. The substrate has a terminal. The chip is disposed overlying the substrate. The chip has an active surface, having a center region and periphery region. The periphery region has an electrode thereon. The patterned transparent plate is disposed overlying the chip and exposes the electrode. The conductive material electrically connects the electrode and terminal. The encapsulant covers the terminal, conductive material, and electrode, while leaving the cover plate overlying the center region of the chip exposed.

Embodiments of the invention further provide a fabrication method for a package structure. First, a wafer having a plurality of chips is provided. The chips respectively have an active surface, having a center region and periphery region. The periphery regions respectively have an electrode thereon. A patterned cover plate is then formed overlying the wafer. The cover plate exposes the electrodes. Next, the wafer is divided into chips. A substrate, having a terminal, is then provided. At least one of the chips is then attached to the substrate. The electrode and terminal are then electrically connected. Finally, an encapsulant is formed covering the terminal and the electrode, while leaving the cover plate overlying the center region of the chip exposed.

Further scope of the applicability of the present invention will become apparent from the detailed description given hereinafter. However, it should be understood tat the detailed description and specific examples, while indicating preferred embodiments of to invention, are given by way of illustration only, since various changes and modifications within the spirit and scope of the invention will become apparent to those skilled in the an from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in the art.

Figure 1:
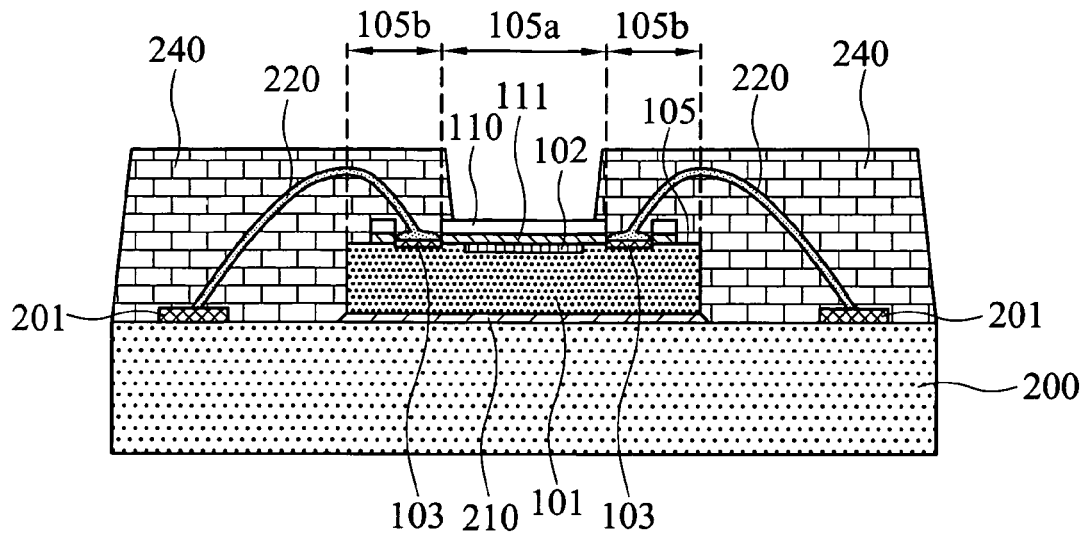
FIG. 1 is a cross-section of a package structure of a first embodiment of the invention.

FIG. 1 is a cross-section of the package structure of the first embodiment of the invention. The structure comprises a substrate 200, chip 101, patterned cover plate 110, conductive material 220, and encapsulant 240.

The substrate 200 can be a printed circuit board or a lead frame as desired. The substrate 200 has an attachment area 202 and a terminal 201 disposed beyond the attachment area 202.

The chip 101 is overlying the chip attachment area 202 of the substrate 200. A adhesive layer 210, such as a thermosetting epoxy with or without silver particles, is typically disposed between the substrate 200 and chip 101 to facilitate attachment. The chip 101 has an active surface 105, comprising a center region 105a and periphery region 105b. The periphery region 105b has an electrode 103 thereon. The chip 101 may further have an image sensor 102 in the center region 105a to enabling use thereof as an image chip for use in digital cameras or other electronic products capturing image or video.

The patterned cover plate 110 is disposed overlying the chip 101, and exposes the electrode 103. An adhesive layer 111, such as a thermosetting resin, is disposed between the chip 101 and cover plate 110 as desired to facilitate connection therebetween. When the chip 101 is an image chip, the cover plate 110 is a transparent material such as glass to allow image or video capture. Thence, the optional adhesive layer 111 must also be a transparent material, such as epoxy. When the chip 101 does not have image sensor 102, the cover plate 110 can be any known material and is preferably an encapsulant material or thermally conductive material. Note that glass or transparent material can also be employed.

The conductive material 220 electrically connects the electrode 103 and terminal 201. In this embodiment, the conductive material 220 is gold or aluminum wire for wire-bonding technology. The conductive material 220 may further have other known alloy compositions as desired.

The encapsulant 240 covers the terminal 201, conductive material 220, and electrode 103, while leaving the cover plate 110 overlying the center region 105a of the chip 101 exposed. The encapsulant 240, such as a mixture comprising thermosetting epoxy and silica fillers, can be formed by a molding process or dispensing process, capable of substantially removing air from the encapsulant of the package structure. The exposed cover plate 110 provides a field of view for the image sensor 102 when the chip 101 is an image chip. When the chip 101 is not an image chip, the exposed cover plate 110 may further connect to a device such as heat sink to assist for heat dissipation.

Figure 2:
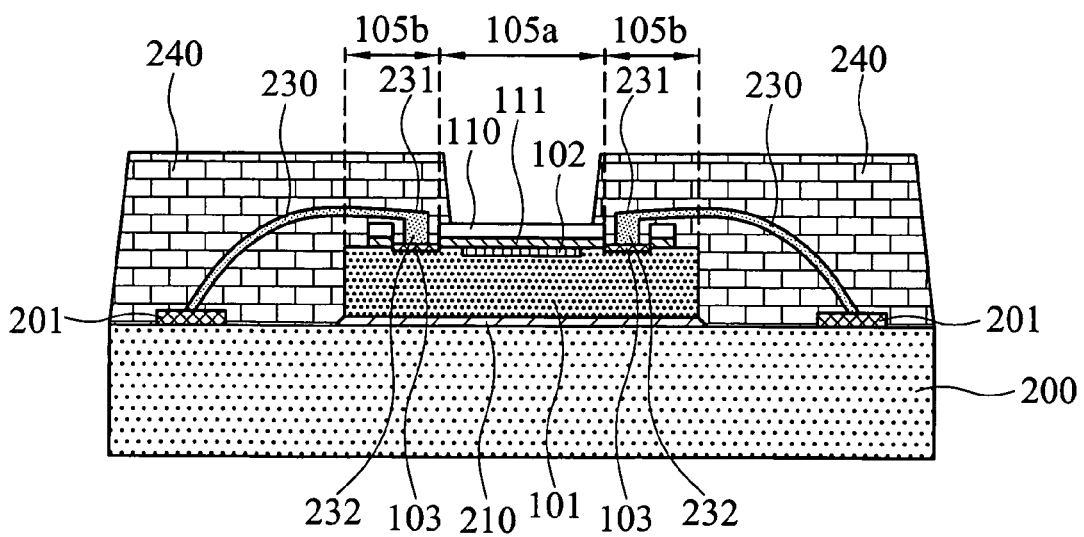
FIG. 2 is a cross-section of a package structure of a second embodiment of the invention.

In FIG. 2, a cross-section of the package structure of the second embodiment of the invention is shown.

Compared to that shown in FIG. 1, electrical connection between the electrode 103 of chip 101 and terminal 201 of substrate 200 is achieved by application of a conductive material 230, which serves a conductive lead for tape automatic bonding (TAB) technology. The conductive material 230 is extended from the terminal 201 and has an extending end 231. A conductive bump 232 electrically connects the electrode 103 and conductive material 230, achieving electrical connection between the electrode 103 and terminal 201. The conductive bump 232 can be previously formed on the extending end 231 or electrode 103 as desired. Further, the encapsulant 240 covers the terminal 201, conductive material 230, and electrode 103, while leaving the cover plate 110 overlying the center region 105a of the chip 101 exposed.

Different from the conventional technology, the chip 110 is encapsulated by cover plate 110 and encapsulant 240 formed by molding or dispensing. Therefore, a specially designed chip carrier with a dam is not required, and application of a common substrate 200 such as a printed circuit board or lead frame can achieve the package structure of the invention, resulting in reduced process cost, further capable of substantially removing air from the encapsulant of the package structure of the invention, resulting in improved product reliability. The encapsulant 240 formed by molding or dispensing, is more reliable than the conventional dam-glass structure. Therefore, required additional encapsulation testing is minimized, resulting in reduced product cost and increased throughput. Furthermore, electrical connection between the chip 101 and substrate 200 is achieved by the conductive material 220 or 230 as previously described. Thus, no complicated and specially designed wirings are required, resulting in further improvement of product yield and throughput, and further reduction in product cost.

Fabrication methods of the package structure of the invention are described in the following. Steps shown in FIGS. 3A through 3F followed by FIGS. 4A and 4B achieve the package structure shown in FIG. 1, and those shown in FIGS. 3A through 3F followed by FIGS. 5A and 5B achieve the package structure shown in FIG. 2.

Steps shown in FIGS. 3A through 3F, steps mainly regard attachment of cover plate 110 of this embodiment of the invention. Each chip 101 of the package structure of this embodiment of the invention are substantially encapsulated prior to attaching to a substrate 200, which is capable to prevent particle accumulation on or other contamination to the chips 101, further improving production yield.

Figure 3A:
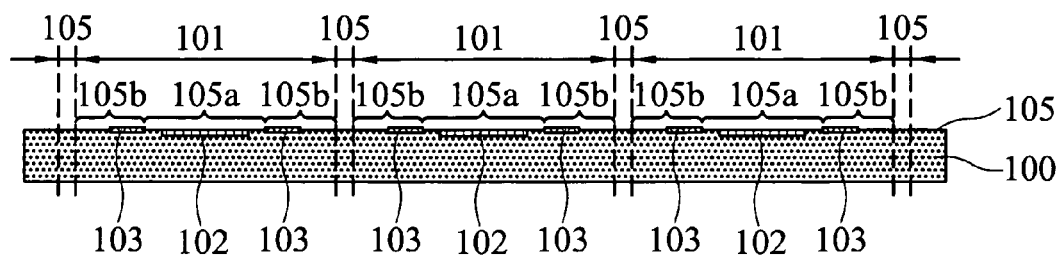
FIGS. 3A through 3F are cross-sections of a first series of steps of fabrication methods applicable to the first and second embodiments of the invention.

In FIG. 3A, first, a wafer 100, such as a semiconductor wafer, having a plurality of chips 101 is provided. Each chip 101 has an active surface 105, having a center region 105a and periphery region 105b. Each periphery region 105b has an electrode 103 for electrical connection to an external device such as a substrate disposed thereon. An image sensor 102 is optionally formed in the center region 105a when the chip 101 is an image chip. The wafer 100 preferably has a plurality of saw streets 105 between the chips 101 for subsequent division.

Next, in FIGS. 3B through 3E, preferred steps for forming a patterned cover plate 110 are shown. Note that the steps shown in FIGS. 3B through 3E are examples, and are not intended to limit the scope of the invention. Those skilled in the art will recognize the possibility of using various steps to achieve formation of the patterned cover plate 110.

Figure 3B:
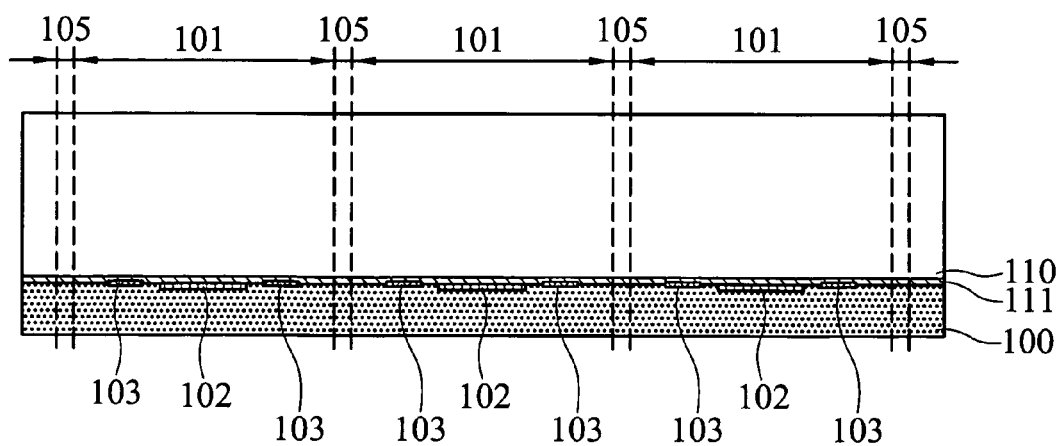

In FIG. 3B, a cover plate 110 is formed overlying the wafer 100. An optional adhesive layer 111 is preferably formed overlying the wafer 100 prior to forming the cover plate 110 for better adhesion between the wafer 100 and cover plate 110. When the chip 101 is an image IC, the adhesive layer 111 and cover plate 110 are preferably transparent to provide a field of view for the image sensor 102. Thus, the adhesive layer 111 preferably comprises transparent thermosetting epoxy, and the cover plate 110 is glass, or other transparent materials. When the chip 101 is not an image chip and does not have the image sensor 102, the cover plate 110 can be any known material and is preferably an encapsulant material or thermally conductive material. Note that glass or transparent material can also be employed.

Figure 3C:
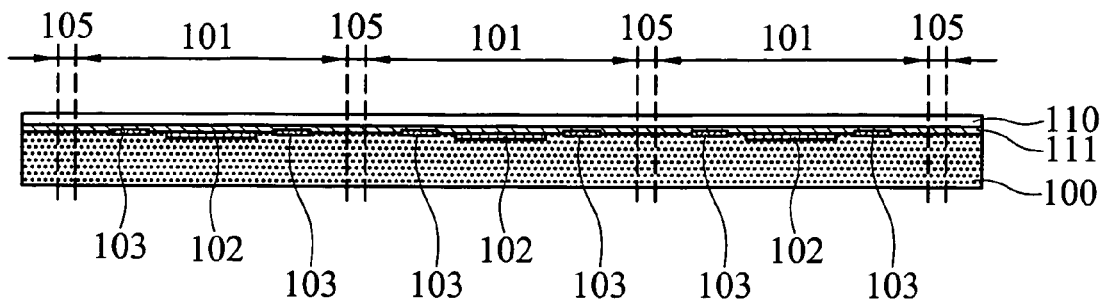

In FIG. 3C, an optional grinding step may be performed to grind the cover plate 110 to a predetermined thickness when desired.

Figure 3D:
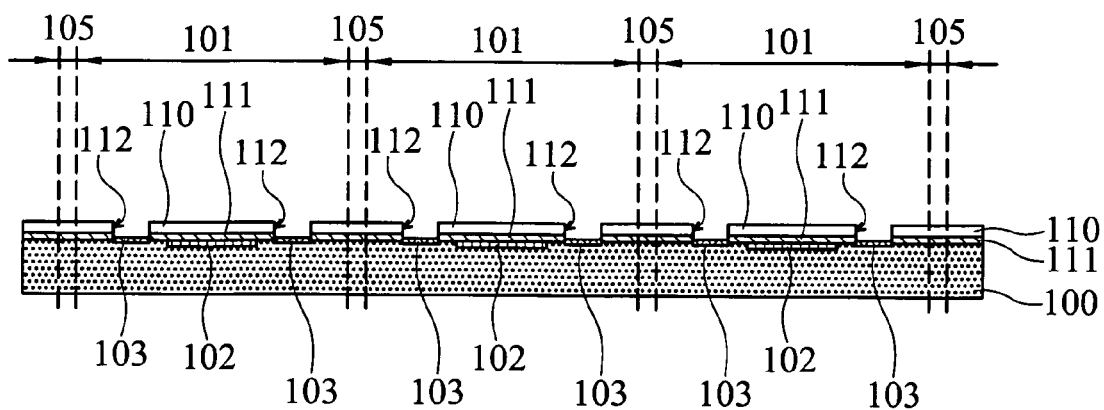

In FIG. 3D, the cover plate 110 and optional adhesive layer 111 are patterned, forming openings 112 respectively exposing the electrodes 103. Thus, the chips 101 are substantially encapsulated by the cover plate 110 in addition to the exposed electrodes 103. The cover plate 110 and optional adhesive layer 111 are patterned by a method such as anisotropic etching, laser drilling, or other methods to expose the electrodes 103.

Figure 3E:
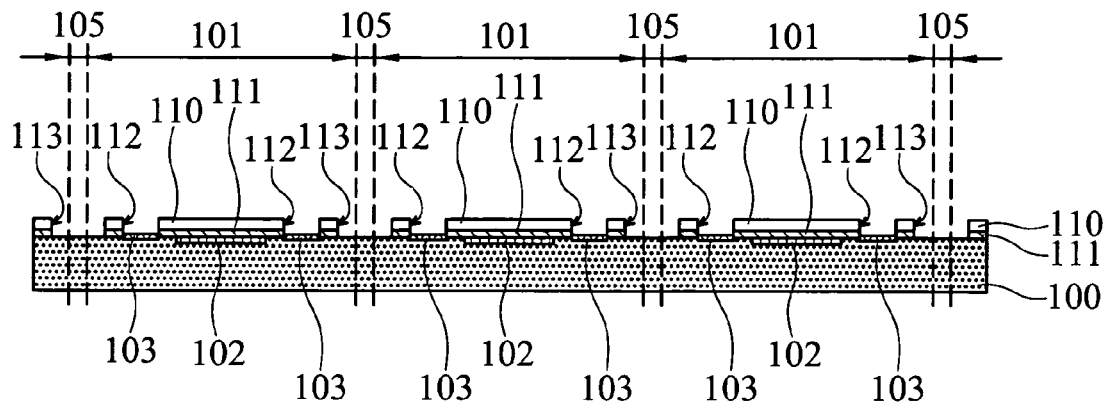

As shown in FIG. 3E, when the wafer 100 has saw streets 105 between chips 101, the patterned cover plate 110 preferably has openings 113 respectively exposing the saw streets 105 to simplify the subsequent wafer division step and prevent damage to cover plate 110 during the wafer division step. Advantages are enumerated in the following description. The openings 112 and 113 may be formed in one patterning step or in individual steps as desired.

Figure 3F:
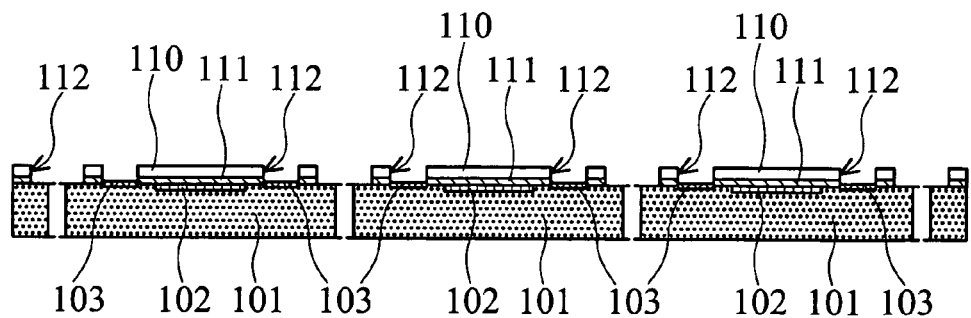

In FIG. 3F, the wafer 100 shown in FIG. 3D or 3E is divided into individual chips 101 by a mechanical method such as sawing, a chemical method such as anisotropic etching, or other division methods. When the wafer 100 has saw streets 105, the division can be performed along the saw streets 105 to prevent damage to the chips 101.

In the mechanical method, a rotating metal or diamond blade is employed to saw the wafer 100 between the chips 100 or along the saw streets 105. When the saw streets 105 are covered by the cover plate 110 shown in FIG. 3D, cover plate fragments caused by sawing may damage the cover plate 110 overlying the chips 101. Thus, the saw streets 105 are preferably exposed as shown in FIG. 3E.

When the wafer 100 is divided by the chemical method, saw streets 105 or regions between the chips 101 are anisotropically etched. When the saw streets are covered by the cover plate 110 shown in FIG. 3D, the cover plate 110, adhesive layer 111, and wafer 100 may be respectively etched resulting from different materials therebetween, complicating the division step. Thus, the saw streets 105 are preferably exposed as shown in FIG. 3E to etch the wafer 100 only in the division step.

Figure 4A:
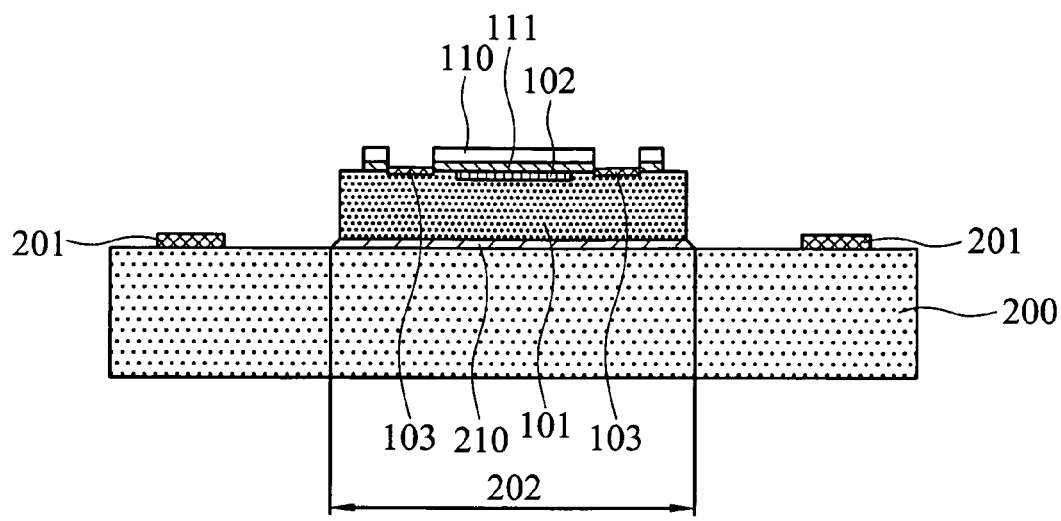
FIGS. 4A and 4B are cross-sections of a second series of steps of the fabrication method applicable to the first embodiment of the invention.

Next, in FIG. 4A, a substrate 200, such as printed circuit board or lead frame, having a terminal 201 is provided, followed by a chip attachment step to attach at least one of the chips 101 to the substrate 200. The substrate 200 may have an attachment area 202 and the terminal 201 arranged beyond the attachment area 202. In the chip attachment step, a adhesive layer 210, such as thermosetting epoxy with or without silver particles, is preferably applied to the attachment area 202, followed by attachment of the chip 101 to the adhesive layer 210 and hardening of the adhesive layer 210. Thus, the chip 101 is fixed to the substrate 200.

Figure 4B:
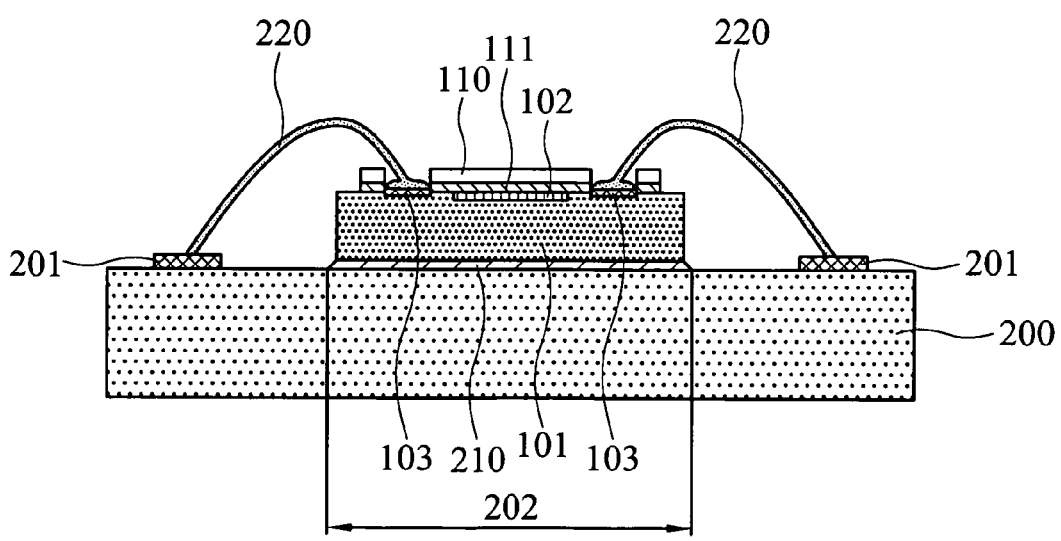

Further, in FIG. 4B, the electrode 103 of the chip 101 and terminal 201 of substrate 200 are electrically connected. The electrical connection between the electrode 103 and terminal 201 is achieved by formation of a conductive material 220, such as a gold wire or aluminum wire, using a method such as wire-bonding technology.

Finally, an encapsulant 240, such as a mixture comprising thermosetting epoxy and silica fillers, is formed to cover the terminal 201, conductive material 220, and electrode 103, while leaving the cover plate 110 overlying the center region 105a of the chip 101 exposed by a method such as molding or dispensing. A post mold cure step may be further performed to further harden the encapsulant 240. Thus, the package structure shown in FIG. 1 is achieved.

Figure 5A:
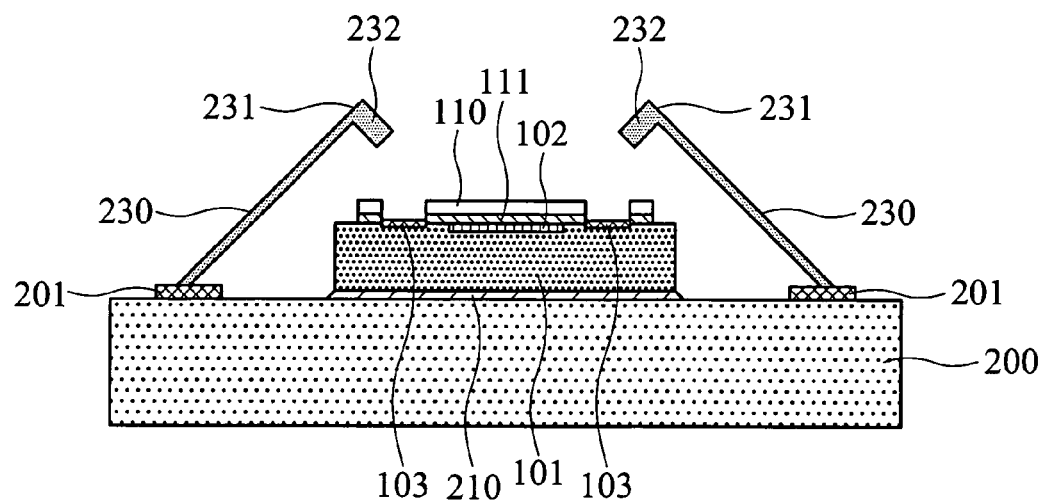
FIGS. 5A and 5B are cross-sections of a second series of steps of the fabrication method applicable to the second embodiment of the invention.
Figure 5B:
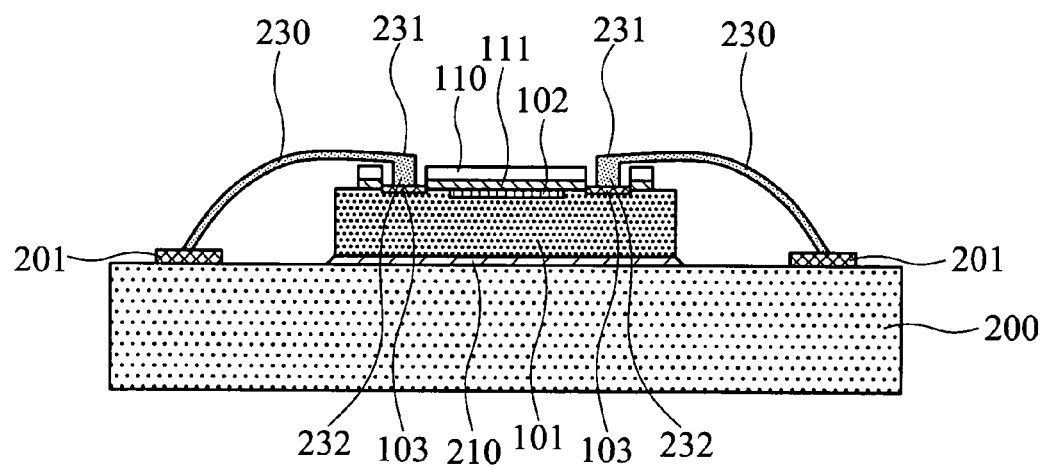
Figure 6:
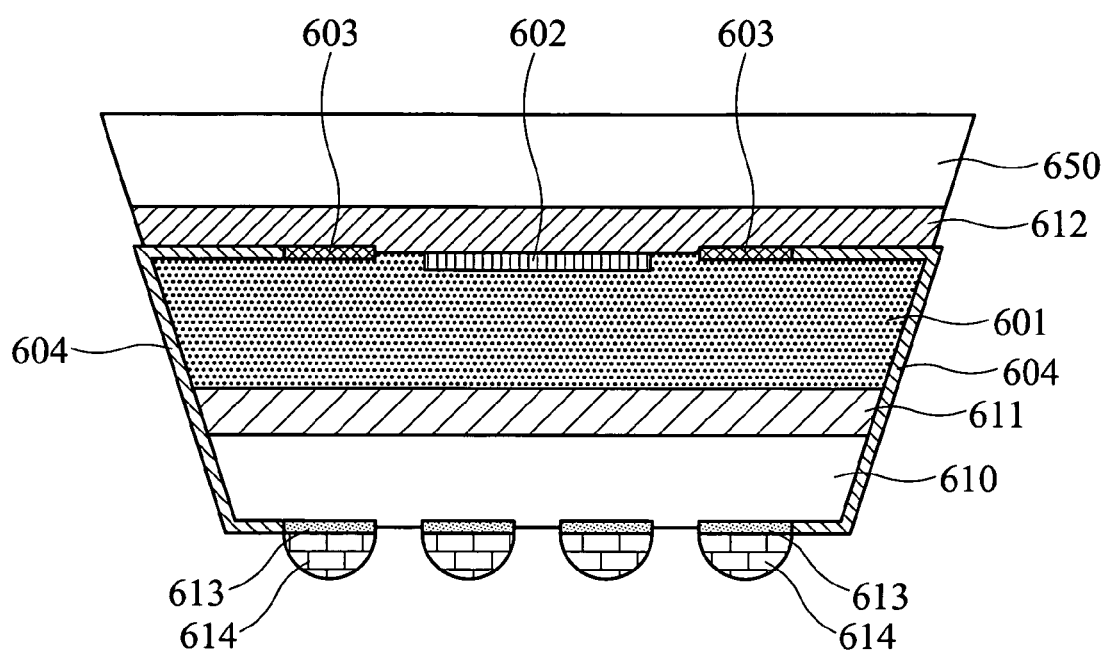
FIG. 6 is a cross-section of a CSP (chip scale package) disclosed by SHELLCASE.

The package structure shown in FIG. 2 is achieved by steps shown in FIGS. 5A and 5B following the step shown in FIG. 3F.

Compared to that shown in FIG. 4A, the substrate 200 in FIG. 5A further has a conductive material 230 such as a lead for TAB technology extending from the terminal 201. The conductive material 230 has an extending end 231 disposed beyond the terminal 201. Details regarding attachment of the chip 101 are the same as those shown in FIG. 4A, and thus, are omitted herefrom. A conductive bump 232 is previously formed on either extending ends 231 or electrodes 103 as desired.

Further, in FIG. 5B, a bonding step is performed to electrically connect the electrode 103 and terminal 201 resulting from the electrical connection between the electrode 103 and extending end 231 using the conductive bump 232.

Finally, an encapsulant 240, such as a mixture comprising thermosetting epoxy and silica fillers, is formed to cover the terminal 201, conductive material 230, and electrode 103, but expose the cover plate 110 overlying the center region 105a of the chip 101 by a method such molding or dispensing. A post mold cure step may be additionally performed to further harden the encapsulant 240. Thus, the package structure shown in FIG. 2 is achieved.

Embodiments of the inventive package structure and fabrication method thereof in reduce structure size, wiring complexities, and chip contamination. Additionally production costs are reduced and product yield and reliability are improved.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A package structure, comprising:
   a substrate comprising a terminal;
   a chip overlying the substrate, the chip comprising an active surface, with a center region and periphery region, the periphery region comprising an electrode thereon;
   a cover plate comprising a first portion overlying the center region and a second portion overlying periphery region of the chip and the electrode completely disposed between the first portion and the second portion, wherein the second portion of the transparent plate is disposed apart from an edge of the chip and the electrode is disposed without overlapping to the cover plate;
   a conductive material electrically connecting the electrode and terminal; and
   an encapsulant covering the terminal, conductive material, and electrode with direct contact to the terminal and the conductive material, while leaving the cover plate overlying the center region of the chip exposed, wherein a top surface of the cover plate is lower than that of the encapsulant.

2. The structure as claimed in claim 1, further comprising an adhesive layer between the chip and the cover plate.

3. The structure as claimed in claim 1, wherein the conductive material comprises a metal wire for wire-bonding technology or a lead for tape automatic bonding (TAB) technology.

4. A package structure, comprising:
   a substrate comprising a terminal;
   a chip overlying the substrate, the chip comprising an active surface, with a center region and periphery region, the periphery region comprising an electrode thereon;
   a transparent plate comprising a first portion overlying the center region and a second portion overlying periphery region of the chip and the electrode completely disposed between the first portion and the second portion, wherein the second portion of the transparent plate is disposed apart from an edge of the chip and the electrode is disposed without overlapping to the transparent plate;
   a conductive material electrically connecting the electrode and terminal; and
   an encapsulant covering the terminal, conductive material, and electrode with direct contact to the terminal and the conductive material, while leaving the transparent plate overlying the center region of the chip exposed, wherein a top surface of the transparent plate is lower than that of the encapsulant.

5. The structure as claimed in claim 4, wherein the chip further comprises an image sensor in the center region.

6. The structure as claimed in claim 4, further comprising a transparent adhesive layer between the chip and the transparent plate.

7. The structure as claimed in claim 4, wherein the transparent plate comprises glass.

8. The structure as claimed in claim 4, wherein the conductive material comprises a metal wire for wire-bonding technology or a lead for tape automatic bonding (TAB) technology.

* * * * *